(12) United States Patent
Saito et al.

(10) Patent No.: US 10,367,140 B2
(45) Date of Patent: Jul. 30, 2019

(54) METHOD FOR MANUFACTURING SECONDARY CELL

(71) Applicant: KABUSHIKI KAISHA NIHON MICRONICS, Tokyo (JP)

(72) Inventors: Tomokazu Saito, Tokyo (JP); Harutada Dewa, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 0 days.

(21) Appl. No.: 15/737,731

(22) PCT Filed: May 17, 2016

(86) PCT No.: PCT/JP2016/002410
§ 371 (c)(1),
(2) Date: Dec. 18, 2017

(87) PCT Pub. No.: WO2016/208116
PCT Pub. Date: Dec. 29, 2016

(65) Prior Publication Data
US 2018/0182959 A1 Jun. 28, 2018

(30) Foreign Application Priority Data
Jun. 25, 2015 (JP) .................. 2015-127653

(51) Int. Cl.
*H01L 49/00* (2006.01)
*B05D 3/06* (2006.01)
(Continued)

(52) U.S. Cl.
CPC .............. *H01L 49/006* (2013.01); *B05D 1/36* (2013.01); *B05D 3/02* (2013.01); *B05D 3/06* (2013.01);
(Continued)

(58) Field of Classification Search
None
See application file for complete search history.

(56) References Cited

U.S. PATENT DOCUMENTS 5,803,961 A * 9/1998 Azuma et al. .... H01L 21/02628
106/287.18
2003/0152813 A1 * 8/2003 Paz de Araujo et al. ..................
H01L 21/02403
428/701

(Continued)

FOREIGN PATENT DOCUMENTS

CN 101573812 A 11/2009
CN 103140933 A 6/2013
(Continued)

OTHER PUBLICATIONS

ISA Japan Patent Office, International Search Report Issued in Application No. PCT/JP2016/002410, dated Aug. 2, 2016, WIPO, 4 pages.
(Continued)

Primary Examiner — Angel Roman
(74) Attorney, Agent, or Firm — McCoy Russell LLP (57) ABSTRACT

A method for manufacturing a secondary cell, the secondary cell including a charging layer that captures electrons by forming energy levels in a band gap by causing a photoexcited structural change in an n-type metal oxide semiconductor coated with an insulating material, includes a coating step to coat a coating liquid so as to form a coating film that includes constituents that will form the charging layer; a drying step to dry the coating liquid coated in the coating step; a UV irradiating step to form a UV-irradiated coating film by irradiating the dried coating film obtained through the drying step with ultraviolet light; and a burning step to burn a plurality of the UV-irradiated coating films, after forming the plurality of UV-irradiated coating films by repeating a set plural times, the set including the coating step, the drying step, and the UV irradiating step.

5 Claims, 4 Drawing Sheets

(51) Int. Cl.
  *B05D 1/36* (2006.01)
  *B05D 3/02* (2006.01)
  *H01M 14/00* (2006.01)
  *H01M 4/04* (2006.01)
  *H01L 29/06* (2006.01)

(52) U.S. Cl.
  CPC .......... *H01L 49/00* (2013.01); *H01M 4/0404* (2013.01); *H01M 4/0471* (2013.01); *H01M 14/005* (2013.01); *B05D 3/065* (2013.01); *H01L 29/0665* (2013.01); *Y02E 10/50* (2013.01)

(56) References Cited

U.S. PATENT DOCUMENTS

| | | | |
|---|---|---|---|
| 2011/0213144 A1* | 9/2011 | Kobayashi et al. | H01G 9/2059 540/591 |
| 2013/0224596 A1 | 8/2013 | Nakazawa | |
| 2015/0188113 A1 | 7/2015 | Kudoh et al. | |
| 2016/0086739 A1* | 3/2016 | Burschka et al. | H01G 9/2063 136/263 |

FOREIGN PATENT DOCUMENTS

| | | |
|---|---|---|
| EP | 2626910 A1 | 8/2013 |
| JP | 2011023200 A | 2/2011 |
| JP | 2016028408 A | 2/2016 |
| TW | 201445801 A | 12/2014 |
| TW | 201508971 A | 3/2015 |
| WO | 2010029751 A1 | 3/2010 |
| WO | 2012046325 A1 | 4/2012 |

OTHER PUBLICATIONS

Taiwan Intellectual Property Office, Office Action and Search Report Issued in Patent Application No. 105118362, dated May 16, 2017, 7 pages. (Submitted with Partial Translation).
European Patent Office, Extended European Search Report Issued in Application No. 16813892.3, Jan. 25, 2019, Germany, 7 pages.

* cited by examiner

| NUMBER OF LAYERS | TWO LAYERS | TWO LAYERS X 2 | THREE LAYERS | THREE LAYERS X 2 |
|---|---|---|---|---|
| MANUFACTURING METHOD 1 | 8.5hr | 17hr | 13hr | 26hr |
| MANUFACTURING METHOD 2 | 4.5hr | 9hr | 5hr | 10hr |

Fig. 4

METHOD FOR MANUFACTURING SECONDARY CELL

CROSS-REFERENCE TO RELATED APPLICATIONS

The present application is a U.S. National Phase of International Patent Application Serial No. PCT/JP2016/002410, entitled "SECONDARY BATTERY MANUFACTURING METHOD," filed on May 17, 2016. International Patent Application Serial No. PCT/JP2016/002410 claims priority to Japanese Patent Application No. 2015-127653 filed on Jun. 25, 2015. The entire contents of each above-cited applications are hereby incorporated by reference in their entirety for all purposes.

TECHNICAL FIELD

The present invention relates to a method for manufacturing a secondary cell.

BACKGROUND ART

The applicant of the present application has developed a cell (hereinafter, called a quantum cell) utilizing a photoexcited structural change of a metal oxide semiconductor with ultraviolet irradiation (Patent Document 1). The secondary cell disclosed in Patent Document 1 is safe as being an all-solid-state type without causing any chemical reaction during charging-discharging processes and is expected to be a technology being superior to a lithium ion cell in terms of output density and power density. The secondary cell in Patent Document 1 has a structure including a first electrode, an n-type metal oxide semiconductor layer, a charging layer, a p-type semiconductor layer, and a second electrode that are layered on a substrate.

In Patent Document 1, the charging layer is formed with a coating pyrolysis method. Specifically, the charging layer is formed by performing a coating step, a drying step, a burning step, and an ultraviolet irradiating step in the order thereof.

CITATION LIST

Patent Literature

Patent Document 1: International Patent Publication No. WO2012/046325

SUMMARY OF INVENTION

Technical Problem

With such a cell, it is considered that a charging capacity can be increased by enlarging a volume of the charging layer. Therefore, it is desired to enlarge a thickness of the charging layer. However, when the charging layer is thickened, is becomes difficult to evenly form the charging layer. When the charging layer is formed unevenly, there arises a fear that sufficient cell performance cannot be obtained. Further, to improve productivity, it is desired to shorten processing time in each step and to reduce the number of steps.

In view of the abovementioned issues, an object of the present invention is to provide a method for manufacturing a secondary cell capable of manufacturing a high-performance secondary cell with high productivity.

Solution to Problem

According to an aspect of the present invention, a method for manufacturing a secondary cell having a charging layer that captures electrons as forming an energy level in a band gap by causing photoexcited structural change on an n-type metal oxide semiconductor covered with an insulating material includes steps of coating coating liquid to form a coating film that includes constituents to be the charging layer; drying to form a dried coating film by drying the coating liquid coated in the coating step; irradiating to form a UV-irradiated coating film by irradiating the dried coating film with ultraviolet; and burning to form a plurality of burned coating films by burning a plurality of the UV-irradiated coating films after forming the plurality of UV-irradiated coating films by repeating, plural times, the coating step, the drying step, and the irradiating step. Accordingly, a high-performance secondary cell can be manufactured with high productivity.

In the abovementioned manufacturing method, it is also possible that the charging layer is formed without burning each of the UV-irradiated coating films while the plurality of UV-irradiated coating films are coated. Accordingly, manufacturing time and facility-using time can be shortened and productivity can be further improved.

In the abovementioned manufacturing method, it is also possible that burning temperature in the burning step is higher than drying temperature in the drying step. Accordingly, the temperature in the drying step is not required to be raised to the extent to exert an influence on cell performance, so that high cell performance can be maintained.

In the abovementioned manufacturing method, it is also possible that the charging layer is formed by irradiating the plurality of burned coating films with ultraviolet. Accordingly, the charging layer capable of charging energy can be formed.

Advantageous Effects of Invention

According to the present invention, it is possible to provide a method for manufacturing a secondary cell capable of manufacturing a high-performance secondary cell with high productivity.

DESCRIPTION OF EMBODIMENTS

In the following, an example of an embodiment of the present invention will be described with reference to the drawings. The description in the following is simply for a preferable embodiment of the present invention and is not intended to limit the scope of the present invention to the following embodiment.

The present invention relates to a method for manufacturing a cell (hereinafter, called a quantum cell in this specification) based on a new charging principle adopting a photoexcited structural change technology at a charging layer. A quantum cell is a secondary cell capable of performing charging-discharging.

The photoexcited structural change is a phenomenon that an interatomic distance of a material is changed by being excited with light irradiation. An n-type metal oxide semiconductor being amorphous metal oxide such as tin oxide has a characteristic to cause photoexcited structural change. According to the photoexcited structural change phenomenon, a new energy level is formed in a band gap of an n-type metal oxide semiconductor.

(Structure of Cell)

Figure 1:
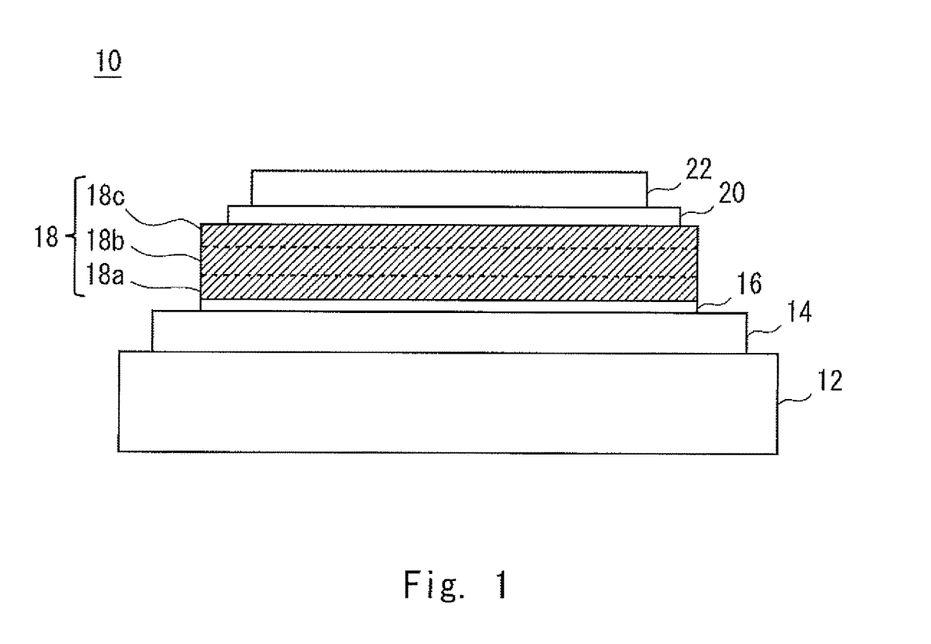
FIG. 1 is a view illustrating a cross-sectional structure of a quantum cell 10 of the present invention.

FIG. 1 is a view illustrating a cross-sectional structure of a quantum cell of the present invention. In FIG. 1, a quantum cell 10 has a layered structure in which a first conductive electrode 14, an n-type metal oxide semiconductor layer 16, a charging layer 18 to which energy is charged, a p-type metal oxide semiconductor layer 20, and a second electrode 22 are layered on a substrate 12 in the order thereof.

The substrate 12 may be made of an insulating material or a conductive material. For example, as the material of the substrate 12, it is possible to use a glass substrate, a resin sheet of a polymer film, a metal foil sheet, or the like.

The first electrode 14 and the second electrode 22 are simply required to have a conductive layer thereon. For example, a metal electrode such as titanium (Ti) may be used as the first electrode. Further, a metal electrode such as chrome (Cr) and copper (Cu) may be used as the second electrode. Examples of another metal electrode include a silver (Ag) alloy film including aluminum (Al). Examples of a method for forming the above include vapor phase film formation such as sputtering, ion plating, electron beam deposition, vacuum deposition, and chemical deposition. Further, a metal electrode may be formed with an electrolytic plating process, a non-electrolytic plating process, or the like. In general, it is possible to use copper, copper alloy, nickel, aluminum, silver, gold, zinc, tin, or the like as a metal to be used for plating.

Titanium dioxide ($TiO_2$), tin oxide ($SnO_2$), zinc oxide (ZnO), or the like may be used as a material of the n-type metal oxide semiconductor layer 16.

A particulate n-type metal oxide semiconductor may be used as a material of the charging layer 18. The n-type metal oxide semiconductor is formed into a layer that has a charging function through photoexcided structural change with ultraviolet irradiation. The n-type metal oxide semiconductor is covered with silicone insulating coating. It is preferable to use titanium dioxide, tin oxide, or zinc oxide as a material of the n-type metal oxide semiconductor adoptable for the charging layer 18. It is possible to use a material in which any two or three of titanium dioxide, tin oxide, and zinc oxide are combined.

Further, in the present embodiment, the charging layer 18 is formed of a plurality of coating films 18a to 18c. That is, the charging layer 18 has a layered structure of the plurality of coating films 18a to 18c. Here, it is exemplified that the charging layer 18 is formed of the three coating films 18a to 18c. It is also possible to have a layered structure in which two, four, or more coating films are layered.

The p-type metal oxide semiconductor layer 20 on the charging layer 18 is formed to prevent electrons from being injected to the charging layer 18 from the second electrode 22 arranged at the above. Nickel oxide (NiO), copper-aluminum oxide ($CuAlO_2$), or the like may be used as a material of the p-type metal oxide semiconductor layer 20.

In the present embodiment, the layers on the substrate 12 maybe layered in the opposite order. That is, it is also possible to have a layered structure in which the first electrode 14 is arranged at as the uppermost layer and the second electrode 22 is arranged at the lowermost layer. In the following, an actually-prepared prototype will be described.

(Prototype Example)

The substrate 12 is formed of glass. On the glass substrate 12, a titanium conductive film is formed as the first electrode 14, and further, the n-type metal oxide semiconductor layer 16 is formed on the first electrode 14 using titanium dioxide ($TiO_2$) with sputtering. The p-type metal oxide semiconductor layer 20 is formed of nickel oxide with sputtering and the second electrode 22 is formed of chrome conductive film.

(Structure of Charging Layer 18)

Figure 2:
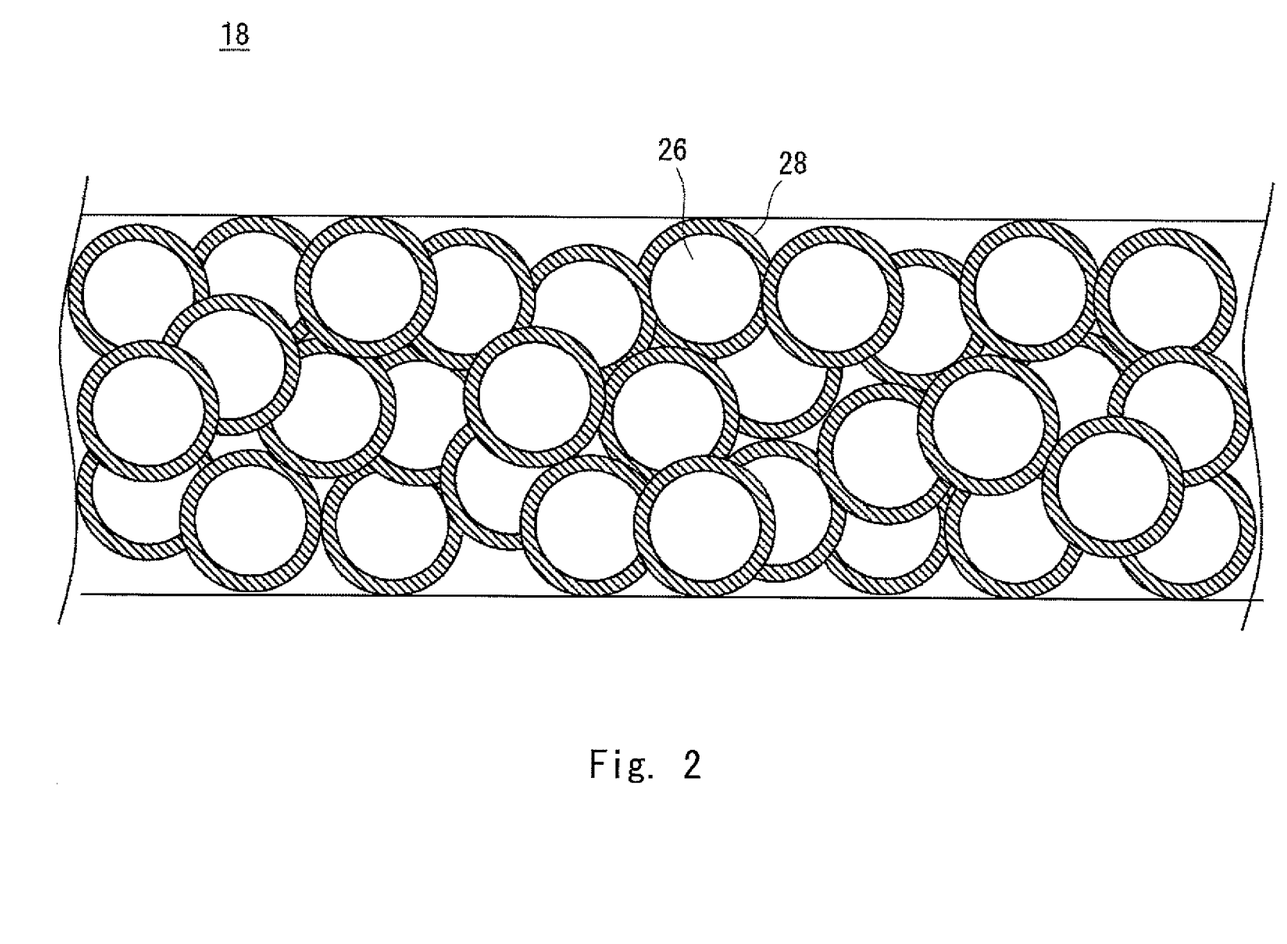
FIG. 2 is a view illustrating, in detail, a structure of a charging layer 18 in FIG. 1.

The charging layer 18 captures electrons as forming an energy level in a band gap by causing photoexcited structural change on the n-type metal oxide semiconductor that is covered with an insulating material. In the following, the structure of the charging layer 18 will be described in detail.

FIG. 2 is a view illustrating in detail the structure of the charging layer 18 in FIG. 1. The charging layer 18 has a structure in which titanium dioxide covered with silicone is filled while using silicone as an insulating film 28 and titanium dioxide as an n-type metal oxide semiconductor 26. The charging layer 18 has a function to store energy due to photoexcited structural change with ultraviolet irradiation to titanium dioxide.

Titanium dioxide, tin oxide, or zinc oxide is used as a material of the n-type metal oxide semiconductor 26 to be used in the charging layer 18 and is generated by decomposing metal aliphatic acid salt in a manufacturing process. Accordingly, as the metal aliphatic acid salt, metal aliphatic acid salt is used that can be changed into metal oxide as being decomposed or burned-up by being irradiated with ultraviolet under oxidizing atmosphere or being burned. For example, aliphatic polycarboxylic acid such as aliphatic monocarboxylic acid, aliphatic dicarboxylic acid, aliphatic tricarboxylic acid, and aliphatic tetracarboxylic acid can be used as the aliphatic acid.

More specifically, saturated aliphatic monocarboxylic acid includes formic acid, acetic acid, propionic acid, caproic acid, enanthic acid, caprylic acid, pelargonic acid, capric acid, stearic acid, and the like. As unsaturated aliphatic monocarboxylic acid, highly unsaturated monocarboxylic acid such as acrylic acid, butane acid, crotonic acid, isocrotonic acid, linolenic acid, and oleic acid may be used.

Further, aliphatic acid salt is easy to be decomposed or burned with heating, has a high solvent solubility, provides a precise film after being decomposed or burned, is easy to be handled and inexpensive, and is easy to synthesize salt with metal. For these reasons, salt formed from aliphatic acid and metal is preferable.

In the insulating film 28, inorganic insulating material such as mineral oil, magnesium oxide (MgO), and silicon dioxide ($SiO_2$) may be adopted other than silicone. As insulating resin, it is possible to adopt thermoplastic resin such as polyethylene, polypropylene, polystyrene, polybutadiene, polyvinyl chloride, polymethyl methacrylate, polyamide, polycarbonate, polyimide, and acetyl cellulose or thermosetting resin such as phenol resin, amino resin, unsaturated polyester resin, allyl resin, alkyd resin, epoxy resin, and polyurethane.

(Method for Manufacturing Charging Layer 18)

Figure 3:
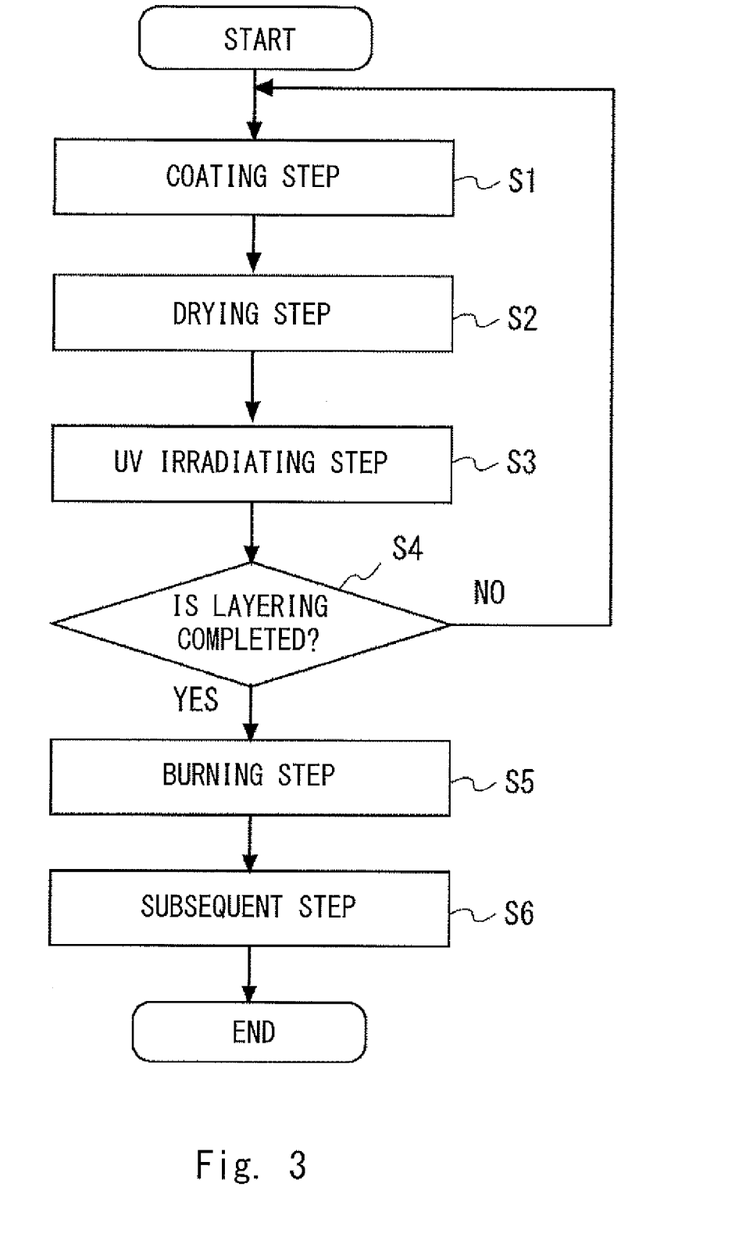
FIG. 3 is a flowchart illustrating steps of a method for manufacturing the charging layer 18.

FIG. 3 is a flowchart illustrating steps of a method for manufacturing the charging layer 18.

First, a substrate is prepared by forming the first electrode 14 and the n-type metal oxide semiconductor layer 16 on the substrate 12. As described above, the first electrode 14 and the n-type metal oxide semiconductor layer 16 can be formed with sputtering or the like. Then, coating liquid is coated on the n-type metal oxide semiconductor layer 16 (a coating step S1). That is, the coating liquid is coated to form the coating film 18*a* that includes constituents to be the charging layer 18. Specifically, the coating liquid is prepared by mixing aliphatic acid titanium and silicone oil into solvent and stirring together. The coating liquid is simply required to contain constituents that turn into the charging layer. Next, the coating liquid is spin-coated on the layer of titanium dioxide with a spinner while rotating the prepared substrate. A thin layer (the coating film 18*a*) having a thickness of 0.3 to 1 um is formed with the rotation of the substrate. This layer has no void as being considered to have a specific structure that metal salt of titanium dioxide covered with silicone is embedded into a silicon layer. Here, not limited to the spin-coating, the coating film may be formed on the n-type metal oxide semiconductor layer 16 with dip coating, die coating, slit coating, gravure coating, spray coating, curtain coating, or the like. Further, it is also possible to perform surface treating on the n-type metal oxide semiconductor layer 16 with ultraviolet irradiation or the like before the coating step.

After the coating step S1, the coating liquid coated on the substrate 12 is dried (a drying step S2). Owing to that the coating liquid is dried in the drying step S2, the solvent in the coating liquid is vaporized, so that the fluid coating liquid becomes to the coating film 18*a* that is tentatively solidified. Accordingly, the substrate 12 can be easily handled. For example, the substrate 12 is placed on a hot plate and heated for a predetermined time at predetermined temperature, so that the solvent in the coating liquid is vaporized. In order to facilitate the handling, the drying step S2 is simply required to be performed at the temperature and time enabling the coating film 18*a* to be tentatively solidified. Not limited to a hot plate, the drying method may adopt heat drying using far-infrared lays, depressurization drying with vacuum processing, or drying with hot-air circulation. The drying step S2 is performed to dry and vaporize the solvent. Therefore, it is preferable that the temperature for drying is 200 degrees Celsius or lower. After the drying step S2, the coating film 18*a* is dried but not in a completely-solidified state. The coating film 18*a* in a state of being tentatively solidified by the drying step S2 is denoted as a dried coating film.

Ultraviolet (hereinafter, called UV light) is irradiated on the coating film 18*a* (dried coating film) on which the drying step S2 has been performed (UV irradiating step S3). A surface of the coating film 18*a* can be UV-hardened by being irradiated with UV light. For example, in the UV irradiating step S3, the coating film 18*a* is irradiated with UV light approximately for one to five minutes. According to the above, the surface of the coating film 18*a* can be in a hardened state. The coating film 18*a* having the surface hardened in the UV irradiating step S3, is denoted as a UV-irradiated coating film.

After the UV irradiating step S3, it is determined whether or not layering of a predetermined number of coating films (UV-irradiated coating films) has completed (S4). When layering of the predetermined number of layers has not been completed (No in S4), it is returned to coating step S1. That is, when the predetermined number of coating films have not been formed, a coating film is layered. Here, the coating film 18*b* being the second layer is formed on the coating film 18*a* being the first layer. Similarly to the above, the coating step S1, the drying step S2, and the irradiating step S3 are performed. The predetermined number of coating films (UV-irradiated coating films) are formed by repeatedly performing a plurality of sets, each set including the coating step S1, the drying step S2, and the UV irradiating step S3. Here, three layers being the coating films 18*a* to 18*c* are layered.

When layering of the predetermined number of layers has been completed (YES in S4), it proceeds to a next burning step (burning step S5). Here, the coating step S1, the drying step S2, and the UV irradiating step S3 may be repeated under the same conditions or different conditions.

In the burning step S5, the coating films 18*a* to 18*c* (UV-irradiated coating films) are burned. Structure of a binding state in the coating films 18*a* to 18*c* can be changed by raising temperature of the substrate 12 in the burning step S5. For example, the substrate 12 is placed in a heat-treating furnace and heat treating is performed in the atmosphere at 380 to 400 degrees Celsius for 5 to 30 minutes. Molecular binding of aliphatic acid can be disconnected by performing heat-treating at 500 degrees Celsius or lower. Not limited to heat-treating in the atmosphere, the heat-treating in the burning step S5 may adopt heating under vacuum, heating in a gas atmosphere, or the like. The burning temperature in the burning step S5 is higher than the drying temperature in the drying step S2. That is, in the burning step S5, the substrate 12 is at a higher temperature than the drying temperature in the drying step S2. The coating films 18*a* to 18*c* burned in the burning step S5 is denoted as burned coating films.

After the burning step S5, it proceeds to the next step (subsequent step S6). In the subsequent step S6, for example, the coating films 18*a* to 18*c* (burned coating films) are irradiated with ultraviolet. The ultraviolet irradiation causes the photoexcited structural change phenomenon as changing an interatomic distance of titanium dioxide of the coating films 18*a* to 18*c* (burned coating films). As a result, a new energy level is formed in a band gap of the titanium dioxide. Energy charging can be performed by electrons being captured to the new energy level.

For example, the irradiation is performed with ultraviolet using a low-pressure mercury lamp illuminance of 20 to 50 mW/cm$^2$ for 2 to 4 hours. The irradiation is repeatedly performed until the burned coating films 18*a* to 18*c* has molecular structure changed thereby and becomes to layers capable of being charged. Thus, the charging layer 18 is formed. Here, not limited to a low-pressure mercury lamp, a high-pressure mercury lamp or a xenon lamp may be adopted as an ultraviolet light source.

The p-type metal oxide semiconductor layer 20, the second electrode 22, and the like can be formed on the charging layer 18. It is preferable that the ultraviolet light source emits light having a wavelength of 405 nm or shorter. An irradiation amount of ultraviolet in the subsequent step S6 is larger than an irradiation amount of the UV irradiating step S3.

As described above, the p-type metal oxide semiconductor layer 20 and the second electrode 22 are formed after the charging layer 18 is formed. Thus, the quantum cell 10 is completed.

(Effects)

According to the manufacturing method of the present embodiment, a predetermined number of the UV-irradiated coating films are layered by repeatedly performing the sets, each set including the coating step S1, the drying step S2, and the UV irradiating step S3. Accordingly, the charging layer 18 can be thickened and a charging capacity thereof can be increased.

Further, in the present embodiment, while coating films are repeatedly layered, the coating step S1 is performed after performing the UV-irradiating step S3 on a surface of the dried coating film. That is, the coating film being an upper layer is formed on the UV-irradiated coating film being a lower layer UV-hardened (dried) in the UV-irradiating step S3. According to the above, when an upper-layer coating film is to be formed, it is possible to suppress peeling of a lower-layer coating film against the upper-layer coating film and dissolving of the lower-layer coating film. Accordingly, unevenness of the upper and lower coating films can be suppressed. Therefore, the UV-irradiated coating films 18a to 18c can be evenly layered and the quantum cell 10 having high performance can be manufactured.

Further, owing to that the UV-irradiating step S3 is performed for each layer, surfaces of the dried coating films 18a to 18c are UV-hardened. In the drying step S2 being a previous step to the UV-irradiating step S3, a surface of the coating film 18a to 18c is not required to be completely dried. Accordingly, the temperature in the drying step S2 is not required to be raised to the extent to exert an influence on cell performance, so that high cell performance can be maintained. Further, since the drying temperature is lower than the burning temperature, the temperature in the drying step S2 is not required to be raised to the extent to exert an influence on cell performance. Consequently, high cell performance can be maintained. For example, in the manufacturing method of the present embodiment, it is not required to raise the temperature of the substrate 12 repeatedly up to the burning temperature at which a binding state in the coating film is changed. Accordingly, in the manufacturing method of the present embodiment, the burned coating film can be prevented from being heated up to the burning temperature for a plurality of times. Consequently, deterioration of cell performance of the quantum cell 10 can be prevented.

In the present embodiment, after the plurality of UV-burned coating films 18a to 18c are formed, the plurality of UV-burned coating films 18a to 18c are burned at once. According to the above, manufacturing time can be shortened. For example, it is assumed that the burning step S5 requires four hours for one time and three films are to be layered. If the burning taking four hours is performed after each of the three coating steps S1, the total time of the burning steps S5 requires 12 hours (four hours×3). In the present embodiment, since the burning step S5 is performed at once after the coating step S1 is performed three times, the time for the burning step S5 becomes to four hours. Thus, in the present embodiment, the burning time can be shortened by eight hours. Here, time required for the UV irradiating step S3 requires one to five minutes, that is sufficiently short compared to the burning step S5. Accordingly, the quantum cell 10 having high performance can be manufactured.

Obviously, it is possible to perform the burning step S5 plural times. For example, a first burning step S5 is performed after UV-irradiated coating films being a first layer and a second layer are formed and a second burning step S5 is performed after UV-irradiated coating films being a third layer and a fourth layer are formed. In this case as well, it is preferable that the coating step S1, the drying step S2, and the UV-irradiating step S3 are performed for forming the UV-irradiated coating film at each layer.

Figure 4:
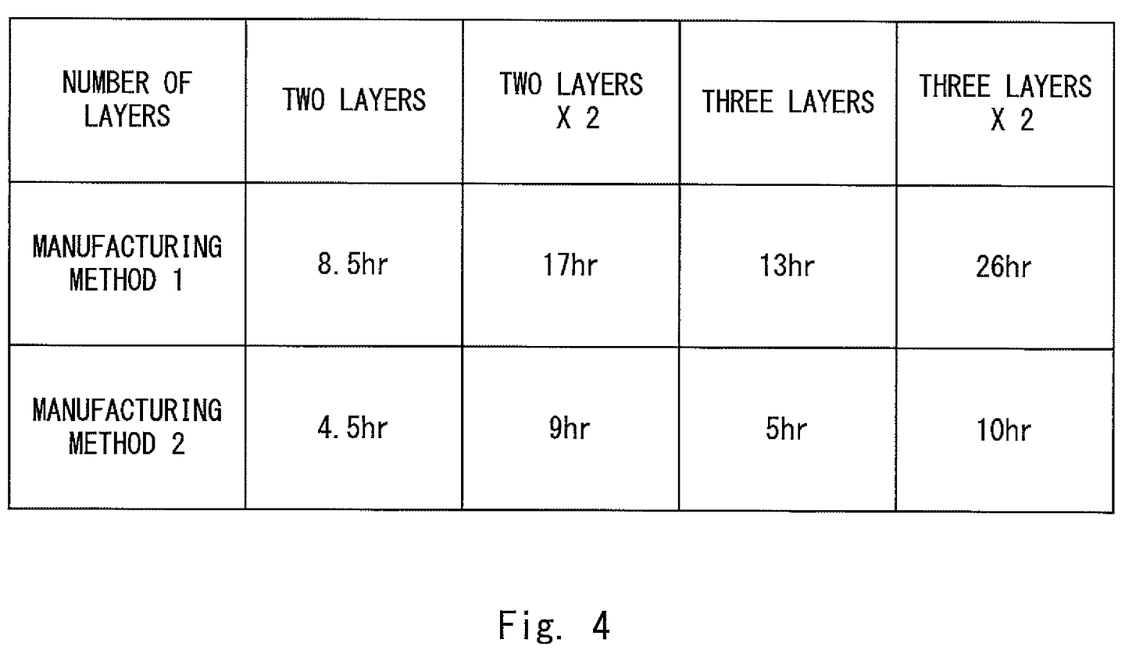
FIG. 4 is a table illustrating an example of specific burning times.

FIG. 4 is a table illustrating an example of specific burning times. FIG. 4 illustrates burning times respectively with manufacturing method 1 in which burning is performed after each coating step S1 and manufacturing method 2 in which burning is performed at once after a plurality times of coating are performed.

In a case that two layers of coating films are formed, manufacturing method 1 in which burning is performed after each coating step S1 requires 8.5 hours as the total of the burning time. On the other hand, in a case that two layers of UV-irradiated coating films are formed, manufacturing method 2 in which burning is performed at once requires 4.5 hours as the burning time.

In a case that forming two layers of coating films are repeated for two sets (two layers×2), manufacturing method 1 requires 17 hours as the burning time. That is, since burning is performed four times in total, it requires twice of the burning time (8.5 hours) for two layers with manufacturing method 1. On the other hand, with manufacturing method 2, since two layers of UV-irradiated coating films are burned at once, two times of burning are to be performed. Accordingly, the burning time becomes twice of the burning time (4.5 hours) of two layers with manufacturing method 2, that is, nine hours.

In a case that three layers of coating films are formed, manufacturing method 1 in which burning is performed after each coating step S1 requires 13 hours as the total of the burning time. On the other hand, in a case that three layers of UV-irradiated coating films are formed, manufacturing method 2 in which burning is performed at once requires five hours as the burning time. Since the charging layer 18 becomes thicker, the burning time in a case that three layers are burned at once becomes longer than that in a case of two layers.

In a case that forming three layers of coating films are repeated for two sets (three layers×2), manufacturing method 1 requires 26 hours as the burning time. That is, since burning is performed six times in total, it requires twice of the burning time (13 hours) for three layers with manufacturing method 1. On the other hand, with manufacturing method 2, since three layers of UV-irradiated coating films are burned at once, two times of burning are to be performed. Accordingly, the burning time becomes twice of the burning time (five hours) of three layers with manufacturing method 2, that is, ten hours.

As manufacturing method 2, owing to that a plurality of UV-irradiated coating films are burned at once after the plurality of UV-irradiated coating films are formed, manufacturing time can be shortened. Accordingly, manufacturing method 2 improves productivity.

Obviously, not limited to two or three layers, the charging layer 18 may have four layers or more. Manufacturing method 2 described above can be adopted in a case of layering a plurality of coating films, that is, two or more thereof. Since three to four hours of the burning step S5 performed after each layering of a coating film can be eliminated, manufacturing time and facility-using time can be shortened. Further, with manufacturing method 2, since a plurality of UV-irradiated coating films are burned at once, the number of steps can be reduced as well. Accordingly, manufacturing method 2 can improve productivity and contribute to cost reduction of a quantum cell.

In the above, examples of the embodiment of the present invention are described. The present invention includes appropriate modification without departing from the object and advantage thereof and is not intended to be limited to the abovementioned embodiment.

This application is based upon and claims the benefit of priority from Japanese patent application No. 2015-127653, filed on Jun. 25, 2015, the disclosure of which is incorporated herein in its entirety by reference.

REFERENCE SIGNS LIST

10 Quantum cell
12 Substrate
14 First electrode
16 N-type metal oxide semiconductor layer
18 Charging layer
18a to 18c Dried coating film, UV-irradiated coating film, Burned coating film
20 P-type metal oxide semiconductor layer
22 Second electrode

The invention claimed is:

1. A method for manufacturing a secondary cell having a charging layer that captures electrons as forming an energy level in a band gap by causing photoexcited structural change on an n-type metal oxide semiconductor covered with an insulating material, the method comprising steps of:

coating coating liquid to form a coating film that includes constituents to be the charging layer, the charging layer including the n-type metal oxide semiconductor and the insulating material;

drying to form a dried coating film by heating the coating liquid coated in the coating step;

irradiating to form a UV-irradiated coating film by irradiating the dried coating film with ultraviolet after the drying step in order to harden a surface of the coating film; and burning to form a plurality of burned coating films by burning a plurality of the UV-irradiated coating films after forming the plurality of UV-irradiated coating films by repeating a set plural times, the set including the coating step, the drying step, and the irradiating step.

2. The method for manufacturing a secondary cell according to claim 1, wherein the charging layer is formed without burning each of the UV-irradiated coating films while the plurality of UV-irradiated coating films is formed.

3. The method for manufacturing a secondary cell according to claim 1, wherein a burning temperature in the burning step is higher than a drying temperature in the drying step.

4. The method for manufacturing a secondary cell according to claim 1, wherein the charging layer is formed by irradiating the plurality of burned coating films with ultraviolet.

5. The method for manufacturing a secondary cell according to claim 1, wherein the coating film includes aliphatic acid, and wherein molecular binding of the aliphatic acid is disconnected by the burning step.

* * * * *